(12) United States Patent
Konishi et al.

(10) Patent No.: US 9,184,320 B2
(45) Date of Patent: Nov. 10, 2015

(54) PHOTOELECTRIC CONVERSION DEVICE

(75) Inventors: Hirofumi Konishi, Chiyoda-ku (JP); Hidetada Tokioka, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 208 days.

(21) Appl. No.: 13/806,024

(22) PCT Filed: Apr. 27, 2011

(86) PCT No.: PCT/JP2011/002483
§ 371 (c)(1),
(2), (4) Date: Jan. 14, 2013

(87) PCT Pub. No.: WO2012/001857
PCT Pub. Date: Jan. 5, 2012

(65) Prior Publication Data
US 2013/0118579 A1    May 16, 2013

(30) Foreign Application Priority Data
Jun. 21, 2010    (JP) .................................. 2010-140612

(51) Int. Cl.
*H01L 31/0224* (2006.01)
*H01L 31/05* (2014.01)
*H01L 31/046* (2014.01)
*H01L 31/056* (2014.01)

(52) U.S. Cl.
CPC  *H01L 31/022466* (2013.01); *H01L 31/022425* (2013.01); *H01L 31/046* (2014.12); *H01L 31/0504* (2013.01); *H01L 31/056* (2014.12); *Y02E 10/52* (2013.01)

(58) Field of Classification Search
None
See application file for complete search history.

(56) References Cited

U.S. PATENT DOCUMENTS 5,055,141 A * 10/1991 Arya et al. .................... 136/258
5,230,746 A *  7/1993 Wiedeman et al. .......... 136/249
(Continued)

FOREIGN PATENT DOCUMENTS

CN     1136858 A    11/1996
CN   101253634 A     8/2008
(Continued)

OTHER PUBLICATIONS

International Search Report Issued May 31, 2011 in PCT/JP11/02483 Filed Apr. 27, 2011.

(Continued)

*Primary Examiner* — Jennifer Michener
*Assistant Examiner* — Christopher Danicic
(74) *Attorney, Agent, or Firm* — Oblon, McClelland, Maier & Neustadt, L.L.P.

(57) ABSTRACT

A photoelectric conversion device includes a front electrode, a photoelectric conversion layer formed of a semiconductor material, a transparent conductive layer formed of a transparent conductive oxide, a back electrode formed of a metal material, and a conductive layer formed of a semiconductor material primarily of silicon and having a refractive index higher than the transparent conductive layer contactually sandwiched between the transparent conductive layer and the back electrode. The photoelectric conversion device exhibits a high photoelectric conversion efficiency by keeping low the electrical resistance between the semiconductor layer and the back electrode and by increasing reflectance for light having passed though the semiconductor layer.

15 Claims, 10 Drawing Sheets

(56) References Cited

U.S. PATENT DOCUMENTS

| | | |
|---|---|---|
| 2006/0174935 A1 | 8/2006 | Sawada et al. |
| 2008/0264483 A1* | 10/2008 | Keshner et al. ............... 136/256 |
| 2010/0243058 A1 | 9/2010 | Meguro et al. |
| 2012/0160298 A1 | 6/2012 | Kanamoto et al. |

FOREIGN PATENT DOCUMENTS

| | | |
|---|---|---|
| CN | 101652895 A | 2/2010 |
| JP | 2001 267598 | 9/2001 |
| JP | 2003 179241 | 6/2003 |
| JP | 2003 258279 | 9/2003 |
| JP | 2005 217046 | 8/2005 |
| JP | 2006 120737 | 5/2006 |
| JP | 2007 266095 | 10/2007 |
| JP | 2009 231505 | 10/2009 |
| WO | 2005 011002 | 2/2005 |
| WO | 2009 057698 | 5/2009 |
| WO | 2009 144944 | 12/2009 |

OTHER PUBLICATIONS

Combined Chinese Office Action and Search Report issued Oct. 31, 2014 in Patent Application No. 201180030581.8 (with Partial English Translation and English Translation of Category of Cited Documents).

* cited by examiner

PHOTOELECTRIC CONVERSION DEVICE

TECHNICAL FIELD

The present invention relates to photoelectric conversion devices that convert sunlight and the like into electricity.

BACKGROUND ART

In photoelectric conversion devices such as solar cells that convert sunlight and the like into electricity, a positive electrode and a negative electrode are formed on the respective sides of a semiconductor layer having a junction, and positive and negative carriers generated in the semiconductor layer are collected to the respective electrodes to output them outside. When light absorption of the semiconductor layer is low, light that is not converted into electricity passes through the semiconductor layer, resulting reduction in efficiency. Hence, the photoelectric conversion efficiency is improved by reflecting back to the semiconductor layer the light having been passed through. To reflect the light, the back electrode on the opposite side to incident sunlight with respect to the semiconductor layer is generally formed of a high reflective metal electrode. Furthermore, a transparent conductive layer is sometimes sandwiched between the semiconductor layer and the back electrode.

Patent Document 1 discloses a structure for enhancing efficiency of a thin-film silicon solar cell, in which a refractive-index adjusting layer, which is formed of a material having a refractive index smaller than the transparent conductive layer formed on the front side of the back electrode, is sandwiched between the back electrode and the transparent conductive layer. For example, when the transparent conductive layer is formed of a gallium-doped zinc oxide (GZO), a silicon dioxide ($SiO_2$) layer is sandwiched between the back electrode formed of silver (Ag) and the transparent conductive layer, thus reducing light that penetrates into and is absorbed by the back electrode and improving the light reflectance of the back electrode.

Patent Document 2 discloses a solar cell that includes a front electrode layer, a back electrode layer, and deposited layers that are sandwiched between the front electrode layer and the back electrode layer, wherein the deposited layers include a first photoelectric conversion layer and a reflection layer that reflects toward the first photoelectric conversion layer a part of light having passed though the first photoelectric conversion layer. The reflection layer is formed of a low refractive-index layer containing a refractive-index adjusting material and a contact layer sandwiched between the low refractive-index layer and the first photoelectric conversion layer. The refractive-index adjusting material is formed of a material having a refractive index lower than the material that the contact layer is formed of, so that the refractive index of the low refractive-index layer is smaller than that of the contact layer. This enhances the reflectance to a level higher than that of a conventional reflection layer consisting primarily of ZnO.

PRIOR ART DOCUMENT

Patent Document

Patent Document 1: JP 2006-120737 A
Patent Document 2: JP 2009-231505 A

DISCLOSURE OF THE INVENTION

Problem that the Invention is to Solve

Patent Document 1 and Patent Document 2 both disclose structures in which a film such as of $SiO_2$, whose refractive index is lower than that of a transparent conductive film on the back side of the semiconductor layer, is sandwiched between the transparent conductive film and the back electrode. However, such a structure, in which a low refractive-index film that is inferior in electrical conductivity is sandwiched between the transparent conductive film and the back electrode, is liable to increase electrical resistance between the semiconductor layer and the back electrode.

Hence, the invention is aimed at realizing a photoelectric conversion device that has a higher photoelectric conversion efficiency by enhancing reflectance for light having passed though the semiconductor layer, with electrical resistance between the semiconductor layer and the back electrode being kept low at the same time.

Means for Solving the Problem

A photoelectric conversion device of the present invention includes a front electrode, a photoelectric conversion layer formed of a semiconductor material, a transparent conductive layer formed of a transparent conductive oxide, and a back electrode formed of a metal material that are layered on a light-transmissive insulation substrate in that order, wherein a conductive layer is formed of a semiconductor material consisting primarily of silicon and having a refractive index higher than the transparent conductive layer is contactually sandwiched between the transparent conductive layer and the back electrode.

Advantage of the Invention

Since a conductive layer that is formed of a semiconductor material consisting primarily of silicon is contactually sandwiched between the transparent conductive layer and the back electrode, it is possible to keep low the electrical resistance between the semiconductor layer and the back electrode, and further to enhance easily reflectance particularly for long-wavelength light having passed through the semiconductor layer.

BEST MODE FOR CARRYING OUT THE INVENTION

Hereinafter, embodiments of a photoelectric conversion device according to the present invention will be described with reference to the drawings. It should be noted that the present invention is not limited to the following description but may be appropriately modified without departing from the scope of the present invention. Furthermore, the scale and the like of each member in some drawings shown below may be different from its actual size for ease of understanding. That is the same between the drawings.

Embodiment 1

Figure 1:
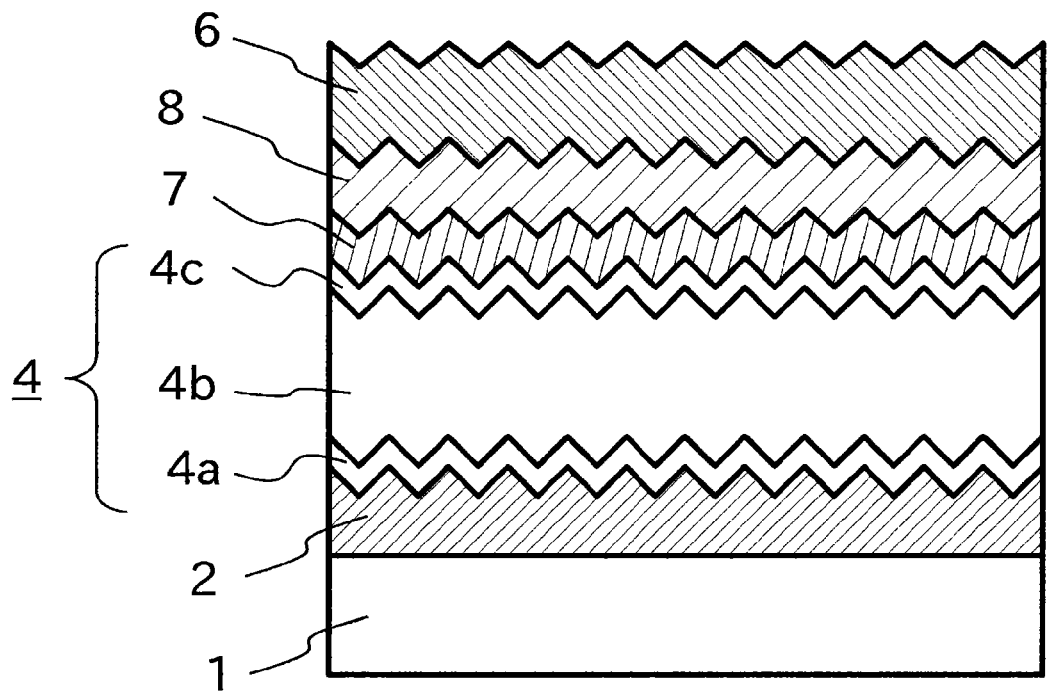
FIG. 1 is a schematic cross-sectional view illustrating a structure of a photoelectric conversion device according to an embodiment of the present invention.

FIG. 1 is a schematic cross-sectional view illustrating a structure of a photoelectric conversion device according to an embodiment of the present invention. As shown in FIG. 1, the photoelectric conversion device has, on a light-transmissive insulation substrate 1, a front electrode 2 that is a transparent electrode layer; a photoelectric conversion layer 4 that is a thin film semiconductor layer formed on the front electrode 2; a transparent back conductive layer 7 that is made of a transparent conductive oxide material and formed on the photoelectric conversion layer 4; a conductive layer 8 that is formed on the transparent back conductive layer 7; and a back electrode 6 that is made of a metallic material and formed on the conductive layer 8. The conductive layer 8 is contactually sandwiched between the transparent back conductive layer 7 and the back electrode 6. Various light-transmissive insulation substrates such as of glass, transparent resin, plastic, and quartz are used for the light-transmissive insulation substrate 1.

The front electrode 2 is formed of a transparent conductive oxide (TCO) that includes at least one of zinc oxide (ZnO), indium tin oxide (ITO), tin dioxide ($SnO_2$), and indium oxide ($In_2O_3$). The front electrode may also be formed of a light-transmissive film such as of the transparent conductive oxide doped with at least one of elements selected from aluminum (Al), Gallium (Ga), boron (B), and the like. The front electrode 2 may have such a surface texture structure that asperities are formed on its surface as shown in the figure. The surface texture structure serves a function of scattering incident sunlight to enhance light utilization efficiency of the photoelectric conversion layer 4. Such front electrode 2 can be formed using various methods such as a sputtering method, an electron-beam deposition method, an atomic-layer deposition method, an atmospheric-pressure chemical vapor deposition (CVD) method, a low-pressure CVD method, a metal-organic chemical vapor deposition (MOCVD) method, a sol-gel method, a printing method, and a spray method.

The photoelectric conversion layer 4 is formed of a silicon-based thin film semiconductor layer that has p-i-n semiconductor junctions formed by a p-type semiconductor layer 4a, an i-type semiconductor layer 4b, and an n-type semiconductor layer 4c that are layered in that order and substantially in parallel to the principal surface of the light-transmissive insulation substrate 1. Such a silicon-based thin film semiconductor layer can be formed of a silicon semiconductor or a thin-film silicon semiconductor doped with at least one of carbon, germanium, oxygen, and other element. The photoelectric conversion layer 4 is formed using a deposition method such as a plasma CVD method or a thermal CVD method.

In order to improve junction characteristics of the respective layers in the photoelectric conversion layer 4, a semiconductor layer, such as a non-single-crystal silicon (Si) layer, a non-single-crystal silicon carbide ($Si_xC_{1-x}$) layer or a non-single-crystal silicon oxide ($Si_xO_{1-x}$) layer that has an intermediate band gap or an equal band gap of the respective junction layers, may be interposed between the p-type semiconductor layer 4a and the i-type semiconductor layer 4b, and between the i-type semiconductor layer 4b and n-type semiconductor layer 4c. Namely, a semiconductor layer, such as a non-single-crystal silicon (Si) layer, a non-single-crystal silicon carbide ($Si_xC_{1-x}$) layer or a non-crystalline silicon oxide ($Si_xO_{1-x}$) that has an intermediate band gap of the p-type semiconductor layer 4a and the i-type semiconductor layer 4b, may be interposed between the p-type semiconductor layer 4a and the i-type semiconductor layer 4b. Likewise, a semiconductor layer, such as a non-single-crystal silicon (Si) layer, a non-single-crystal silicon carbide ($Si_xC_{1-x}$) layer or a non-single-crystal silicon oxide ($Si_xO_{1-x}$) that has an intermediate band gap or an equal band gap of the i-type semiconductor layer 4b and the n-type semiconductor layer 4c, may be interposed between the i-type semiconductor layer 4b and the n-type semiconductor layer 4c.

The transparent back conductive layer 7 is formed of a TCO that includes at least one of ZnO, ITO, $SnO_2$, and $In_2O_3$. The transparent back conductive layer may also be formed of a light-transmissive film such as a film that is formed of the transparent conductive oxide film doped with at least one or more of elements selected from Al, Ga, B, and the like. The transparent back conductive layer 7 is formed using an electron-beam deposition method, a sputtering method, an atomic-layer deposition method, a CVD method, a low-pressure CVD method, an MOCVD method, a sol-gel method, a printing method, a coating method, or the like.

The conductive layer 8, which is a layer contactually sandwiched between the transparent back conductive layer 7 and the back electrode 6, establishes electrical connection between the transparent back conductive layer 7 and the back electrode 6 and serves a function of reflecting, by using light interference effect, light in a specific wavelength range to the photoelectric conversion layer 4 more than a case with direct contact of the transparent back conductive layer 7 and the back electrode 6. The refractive index of the conductive layer 8 is larger than that of the transparent back conductive layer 7. The conductive layer 8 can be formed of a silicon semiconductor of p-, i- or n-type, or a silicon-based semiconductor thin film consisting primarily of silicon doped with at least one of carbon, germanium, oxygen, and other element. The silicon-based semiconductor thin film is not limited to that having a specific crystalline property such as amorphousness or fine crystallite. The conductive layer 8, unlike the photoelectric conversion layer 4, has no semiconductor junction inside such as p-n or p-i-n.

The film thickness of the conductive layer 8 is preferably adjusted in a range from 30 nm to 300 nm. When the film thickness is less than 30 nm, the reflectance might decrease, and when the film thickness is more than 300 nm, the reflectance might decrease for wavelengths ranging from visible light to near-infrared light. In addition, a film thickness of over 300 nm will probably increase resistance between the transparent back conductive layer 7 and the back electrode 6. Adjusting the film thickness of the conductive layer 8 in a range from 50 nm to 150 nm can increase the reflectance for relatively long-wavelength light of 800 nm to 1000 nm, which light easily passes through the photoelectric conversion layer 4, and particularly shows considerable effect of reducing the connecting resistance between the transparent back conductive layer 7 and the back electrode 6.

The back electrode 6 is formed of a high reflective and conductive layer that includes at least one or more of elements selected from silver (Ag), Al, gold (Au), copper (Cu), nickel (Ni), rhodium (Rh), platinum (Pt), palladium (Pd), titanium (Ti), Chrome (Cr), Molybdenum (Mo), and the like, or of an alloy including any thereof. A metal consisting primarily of Ag is most preferable for increasing reflectance. It is noted that high reflective and conductive materials for the back electrode 6 are not necessarily limited to these specific materials, but may appropriately be chosen from well-known materials.

Figure 2:
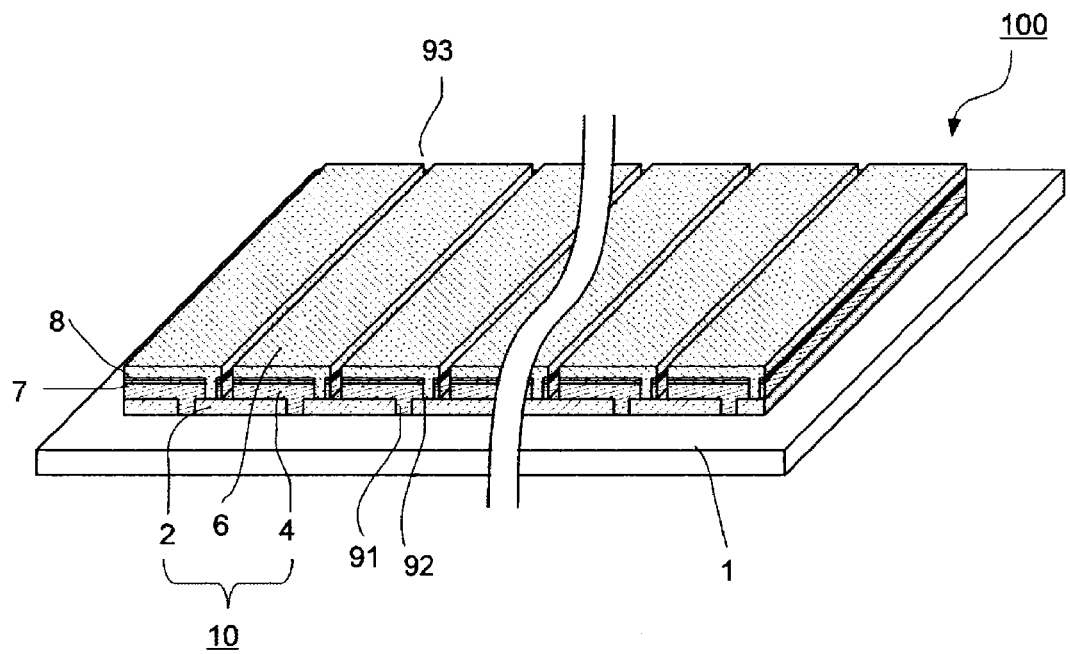
FIG. 2 is an oblique perspective view showing an overall configuration of the photoelectric conversion device according to the embodiment of the present invention.

FIG. 2 is an oblique perspective view showing a typical overall configuration of the photoelectric conversion device according to the embodiment of the present invention. The photoelectric conversion device 100 shown in FIG. 1 is configured with a plurality of segmented and serially connected photoelectric conversion elements 10 on the light-transmissive insulation substrate 1. The photoelectric conversion elements 10 shown in the figure have a substantially long narrow rectangular shape like a strip. A large number of the photoelectric conversion elements 10 are arranged in the direction along their short sides. The figure shows a case of the plurality of photoelectric conversion elements 10 arranged in the direction along a side of the light-transmissive insulation substrate 1. The front electrode 2 is segmented between the adjacent photoelectric conversion elements 10 by forming first grooves 91. The first grooves 91 reach the light-transmissive insulation substrate 1 from the surface of the front electrode 2. The photoelectric conversion layer 4 is deposited on the front electrode 2 thus segmented. In the photoelectric conversion layer 4, second grooves 92 that reach the front electrode 2 from the upper surface of the photoelectric conversion layer 4 are formed at positions slightly away from the first grooves 91. The back electrode 6 is formed on the photoelectric conversion layer 4 to be in contact with the front electrode 2 through inside the second grooves 92, whereby the back electrode 6 for one of the adjacent photoelectric conversion elements 10 is connected in series to the front electrode 2 of the other element. On the opposite side to the first grooves 91 with respect to the second grooves 92, third grooves 93 are formed so that the back electrode 6 is segmented between the adjacent photoelectric conversion elements 10. The transparent back conductive layer 7 and the conductive layer 8 are formed so as to be in contact with each other between the photoelectric conversion layer 4 and the back electrode 6.

While photoelectric conversion devices of various sizes are available, the light-transmissive insulation substrate 1 of large size such as having a side length of 1 to 2 m is generally used for a solar cell panel installed outside. Each of the thin film photoelectric conversion cells 10 is a long narrow rectangle whose short side has a length of, for example, 5 to 10 mm. The solar cell panel is configured such that a large number of the strip-like cells are arranged in parallel on the large substrate at a pitch of 5 to 10 mm on both sides of the third grooves 93. Although not shown in the figure, the thin film photoelectric conversion cells 10 are coated by adhesion with a resin sheet of low moisture permeability, to form a thin film solar cell module.

When light is incident to the photoelectric conversion layer 4 of each photoelectric conversion element 10, free carriers are generated and electromotive force is generated, resulting in generation of current between the front electrode 2 and the back electrode 6. The electric power is extracted externally through not-shown lead lines that are connected to both ends of the serial connection of the photoelectric conversion elements 10.

Figure 3:
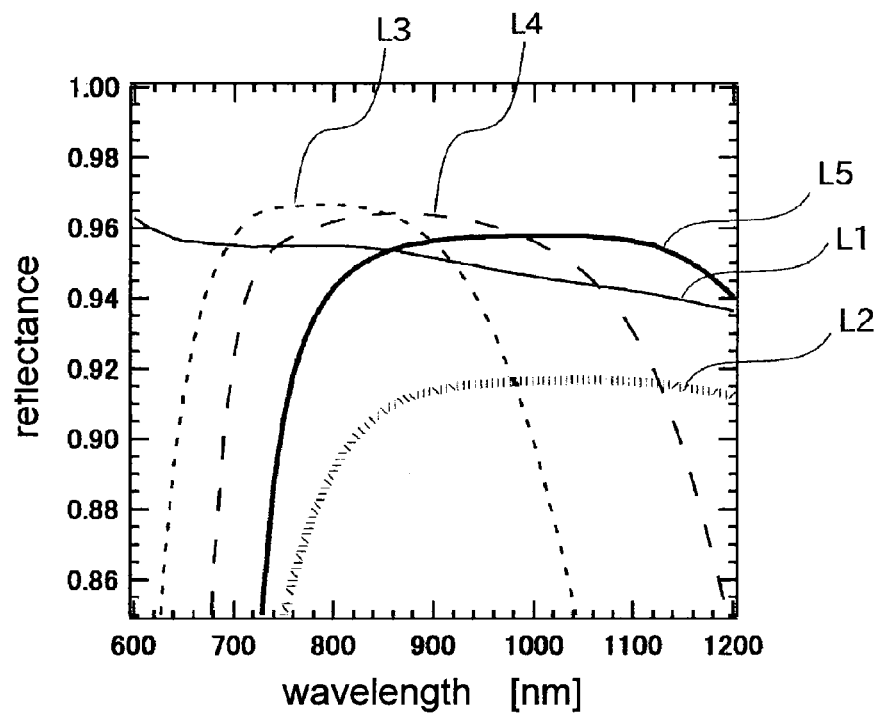
FIG. 3 is a graph showing wavelength-dependent characteristics of reflectance of the photoelectric conversion device according to the embodiment of the present invention.

FIG. 3 is a graph showing wavelength-dependence characteristics of reflectance of the photoelectric conversion device according to the embodiment of the present invention. The graph shows calculation results of overall reflectance of the transparent back conductive layer 7, the conductive layer 8, and the back electrode 6 for the reflection toward the photoelectric conversion layer 4 when light is incident from the photoelectric conversion layer 4 toward the transparent back conductive layer 7, assuming the conductive layer 8 is an n-type amorphous Si. The vertical axis of the graph represents the reflectance assuming the total reflection is unity, and the horizontal axis represents wavelengths (nm). It is assumed in the calculation that the back electrode 6 is formed of Ag and the layer on the light incident side next to the transparent back conductive layer 7 is formed of fine crystalline silicon. It is also assumed that the transparent back conductive layer 7 consists primarily of ZnO and its thickness is 90 nm. In the figure, the lines L1 to L5 represent respective reflection characteristics for variation of thickness of the conductive layer 8 contactually sandwiched between the transparent back conductive layer 7 and the back electrode 6. The line L1 shows a case with the film thickness of the conductive layer 8 being 0 nm; L2, a case with 25 nm; L3, a case with 80 nm; L4, a case with 100 nm; and L5, a case with 120 nm. It is noted that L1 in the figure represents a reflection characteristic for the film thickness of 0 nm, that is, for a conventional photoelectric conversion layer structure not having the conductive layer 8. As indicated by L2, when the film thickness of the conductive layer 8 is 25 nm, the reflectance is lower than that indicated by the conventional L1. However, when the film thickness of the conductive layer 8 is 80 nm, the reflectance for the wavelength range of 700 nm to 900 nm increases more than that of the conventional structure as indicated by L3. It is also found that when the film thickness of the conductive layer 8 is 100 nm, the reflectance for the wavelength range of 750 nm to 1150 nm increases more than that of the conventional structure as indicated by L4; and when the film thickness of the conductive layer 8 is 120 nm, the reflectance for the wavelength range of 850 nm to 1200 nm increases more than that of the conventional structure as indicated by L5. In such a photoelectric conversion device that has the photoelectric conversion layer 4 consisting primarily of silicon, longer wavelength light is easy to pass through toward the back side of the photoelectric conversion layer 4. Increasing the reflectance for the wavelength region around 800 to 1000 nm by choosing appropriately the film thickness of the conductive layer 8 can enhance photoelectric conversion efficiency.

Figure 6:
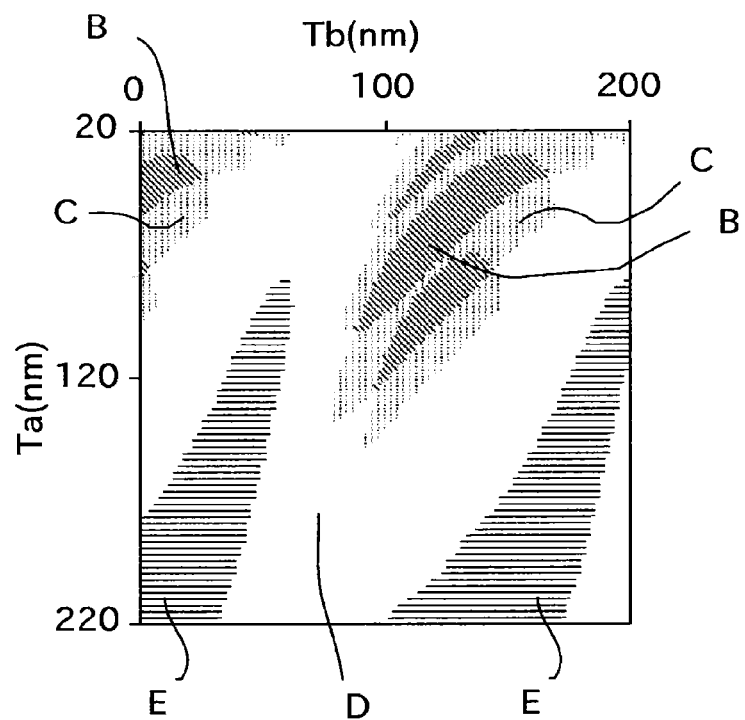
FIG. 6 is a diagram showing a reflectance characteristic of the photoelectric conversion device according to the embodiment of the present invention.
Figure 7:
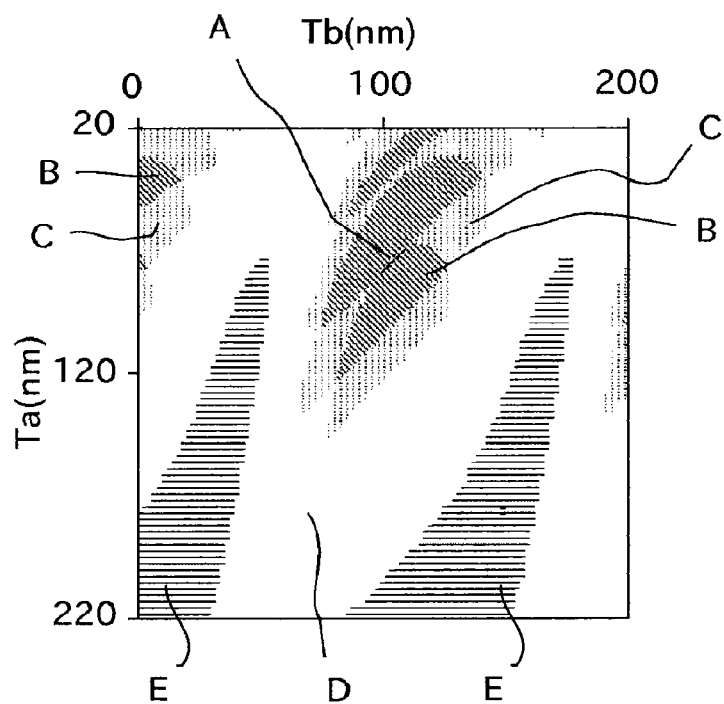
FIG. 7 is a diagram showing a reflectance characteristic of the photoelectric conversion device according to the embodiment of the present invention.
Figure 8:
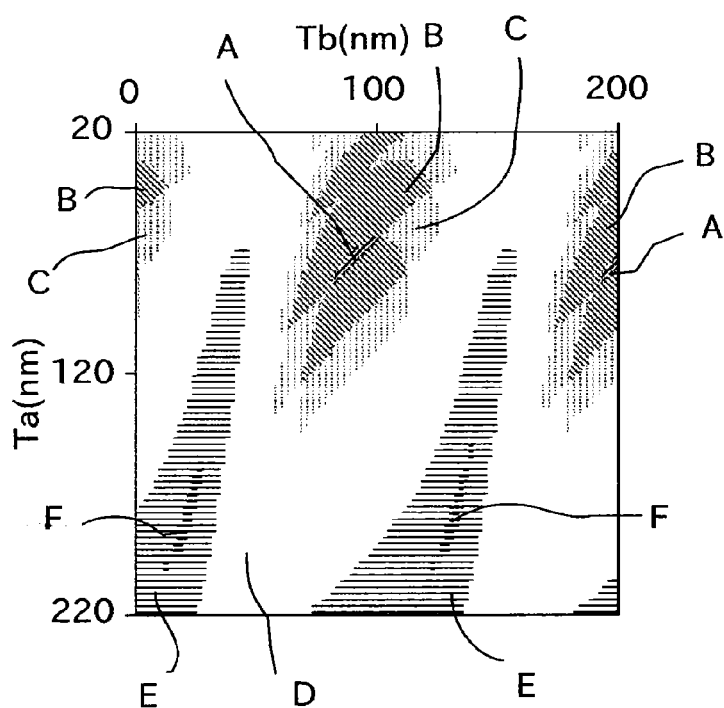
FIG. 8 is a diagram showing a reflectance characteristic of the photoelectric conversion device according to the embodiment of the present invention.

FIGS. 4 through 9 are diagrams showing reflectance characteristics of the photoelectric conversion device according to the embodiment of the present invention. These figures are diagrams two-dimensionally showing calculation of how the reflectance for 850 nm wavelength varies with the film thickness Tb of the conductive layer 8 and the film thickness Ta of the transparent back conductive layer 7 when the optical refractive index of the conductive layer 8 varies. FIGS. 4 through 9 show cases of the refractive index n of the conductive layer 8 being 2.2, 2.6, 3.0, 3.4, 3.8 and 4.2, respectively. In these cases, the conductive layer 8 is assumed to be a transparent film that exhibits no absorption at the wavelength of 850 nm. The reflectance calculations are made, also assuming the transparent back conductive layer 7 is a ZnO film doped with Al, by varying its film thickness Ta from 20 to 220 nm and the film thickness Tb of the conductive layer 8 from 0 to 200 nm. In the figures, the vertical axes represent the film thickness Ta of the transparent back conductive layer 7, and the top ends stand for 20 nm and the bottom ends stand for 220 nm. The horizontal axes represent the film thickness Tb of the conductive layer 8, and the left ends stand for 0 nm and the right ends stand for 220 nm. In these figures, the left ends, which stand for the film thickness Tb of the conductive layer 8 being 0 nm, corresponds to the case with the conventional structure without the conductive layer 8. In the figures, the reflectance is expressed by hatching according to a level of its value. The bold oblique-line region A represents a film thickness region exhibiting reflectance of over 0.97; the oblique-line region B, a film thickness region exhibiting reflectance of more than 0.96 and less than 0.97; the dot region C, a film thickness region exhibiting reflectance of more than 0.95 and less than 0.96; the plain region D, a film thickness region exhibiting reflectance of more than 0.80 and less than 0.95; the horizontal-line region E, a film thickness region exhibiting reflectance of more than 0.60 and less than 0.80; the bold horizontal-line region F, a film thickness region exhibiting reflectance of less than 0.60. In addition, since amorphous Si has a refractive index of about 3.8 at wavelength of 850 nm and exhibits a small light absorbability, FIG. 8 is close to a result for the conductive layer 8 being formed of amorphous Si.

Figure 4:
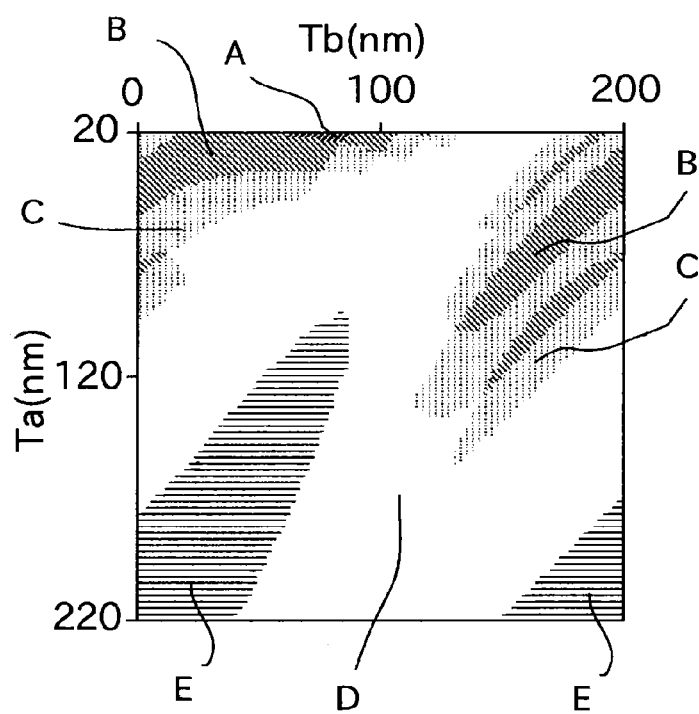
FIG. 4 is a diagram showing a reflectance characteristic of the photoelectric conversion device according to the embodiment of the present invention.
Figure 5:
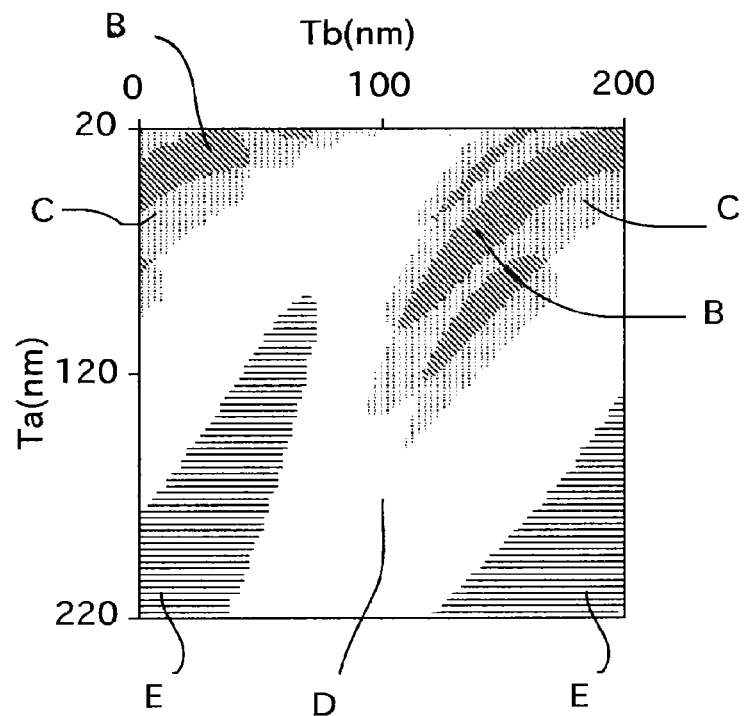
FIG. 5 is a diagram showing a reflectance characteristic of the photoelectric conversion device according to the embodiment of the present invention.
Figure 9:
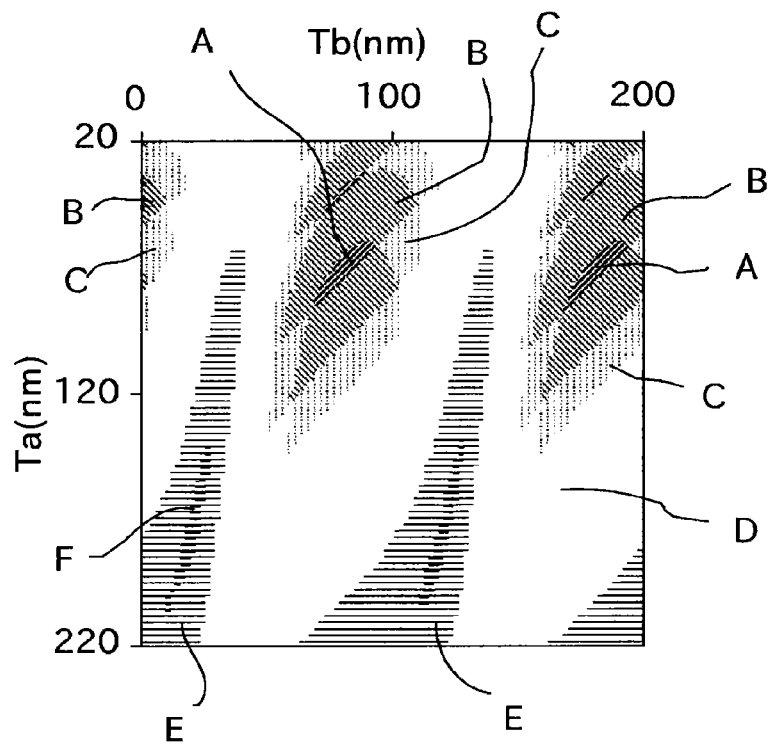
FIG. 9 is a diagram showing a reflectance characteristic of the photoelectric conversion device according to the embodiment of the present invention.

In FIGS. 4 through 9, the left ends are common to the case with the conventional structure having the film thickness Tb of 0 nm. In that structure, the reflectance becomes over 0.95 when the film thickness Ta of the transparent back conductive layer 7 is 40 to 100 nm. When the film thickness Ta increases more than this, there seems a tendency for the reflectance to decrease. This is considered due to influence of the absorption of the transparent back conductive layer 7 in addition to deviation of the interference condition for the film thickness Ta to have a high reflectance. When the conductive layer 8 is formed of a material having a refractive index of 2.2, it is found that a region exhibiting a reflectance higher than the case with the conventional structure appears as shown in FIG. 4 in the region of Ta of about 20 nm and Tb of 70 to 80 nm (the bold oblique-line region A). When the conductive layer 8 is formed of a material having a refractive index of 2.6 or 3.0, only the same level of reflectance as the case with the conventional structure can be obtained within the calculation range as shown in FIGS. 5 and 6, respectively. However, when the conductive layer 8 is formed of a material having a refractive index of 3.4, 3.8 or 4.2 to further increase the refractive index, it is found that there appear higher reflectance regions (the bold oblique-line region A) than the case with the conventional structure as shown in FIGS. 7 through 9, respectively. Although not shown in the figure, when the material for the conductive layer has a refractive index of 4.6, there also appear higher reflectance regions than the case with the conventional structure. Accordingly, it is possible to increase the reflectance more than the case with the conventional structure when the conductive layer 8 has a refractive index of 3.4 or higher at 850 nm wavelength. The higher reflectance regions tend to become broader as the refractive index increases. While the above fact has been described in the case of 850 nm wavelength, the similar trend holds also for wavelengths of 800 to 1100 nm. In addition, the transparent back conductive layer 7 is not limited to an Al doped ZnO film. A film that has the same level of refractive index and optical absorbability, for example, a refractive index of about 1.9 to 2.1 and an absorbability in near-infrared region of 800 to 1100 nm, exhibits the similar trend.

From the above results, use of a material having a refractive index of 2.2 or lower for the conductive layer 8 may be considered as a method of increasing the reflectance. However, there are no other materials for such a material but a high resistance material having significantly low conductivity or a transparent conductive material having absorbability in near infrared region. It is difficult to achieve a higher reflectance than that of the conventional structure without increasing resistance largely by employing as the conductive layer 8 a material having a refractive index lower than the transparent back conductive layer 7. On the other hand, when a material having a refractive index higher than the transparent back conductive layer 7 is used for the conductive layer 8, a high reflectance can be obtained when the refractive index is 3.4 or higher although almost no effect of obtaining a high reflectance can be achieved when the refractive index is 2.6 to 3.0. For such a high refractive-index material, semiconductor materials are suitable; in particular, a semiconductor material consisting primarily of silicon is optimal in light of easy manufacturing. The crystal structure of the conductive layer 8 may be amorphous, fine crystalline, crystalline, or nanocrystalline, or a structure mixed with them. In order to enhance the conductivity, the crystal structure of the conductive layer 8 is preferable to be fine crystalline or crystalline rather than amorphous. Employing an amorphous structure, on the other hand, exhibits a high refractivity, a high reflectance over a wide range of film thickness, and an advantage to controllability in film forming and of film thickness, in comparison with a case of employing a fine crystalline structure and a crystalline structure. When the conductive layer is formed of a material consisting primarily of silicon, the material may contain carbon, germanium, or the like. Since the conductivity of semiconductor materials can be adjusted by doping an impurity, it is easy to keep a good electrical conduction between the photoelectric conversion layer 4 and the back electrode 6. The semiconductor material preferably has a dark conductivity of over $1 \times 10^{-8}$ S/cm, more preferably over $1 \times 10^{-6}$ S/cm by doping an impurity such as phosphorous (P) or boron (B) into silicon. The transparent back conductive layer 7 and the conductive layer 8 are preferably the same electrical conductivity type from the viewpoint of electrical connectivity. Since a generally-used transparent conductive material such as ZnO, ITO, $SnO_2$, and $In_2O_3$ is an n-type conductivity material, the conductive layer 8 is preferably formed of a semiconductor of the same n-type and phosphorus (P) is preferably used as an impurity.

Figure 10:
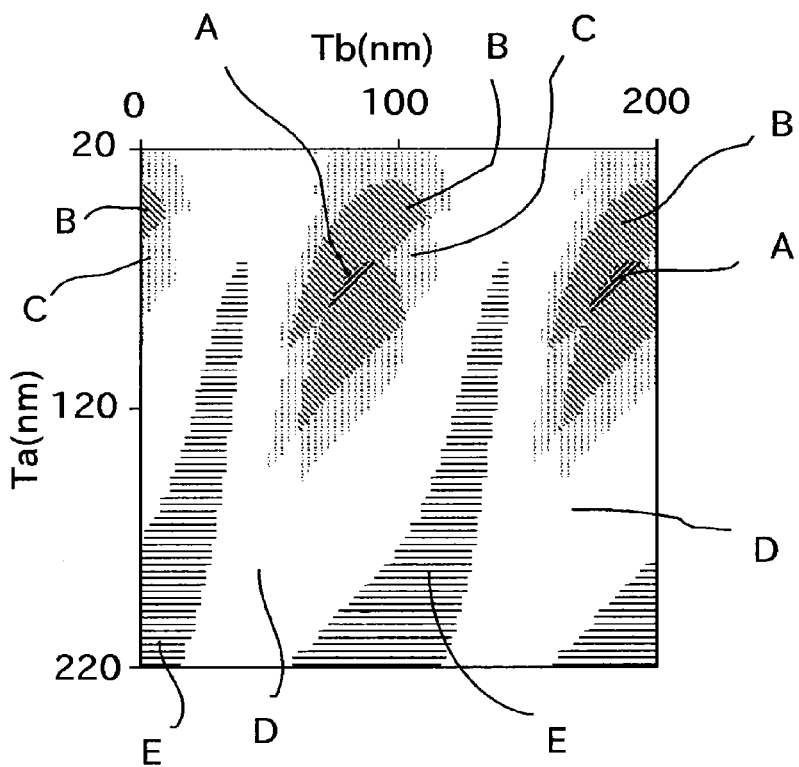
FIG. 10 is a diagram showing a reflectance characteristic of the photoelectric conversion device according to the embodiment of the present invention.
Figure 11:
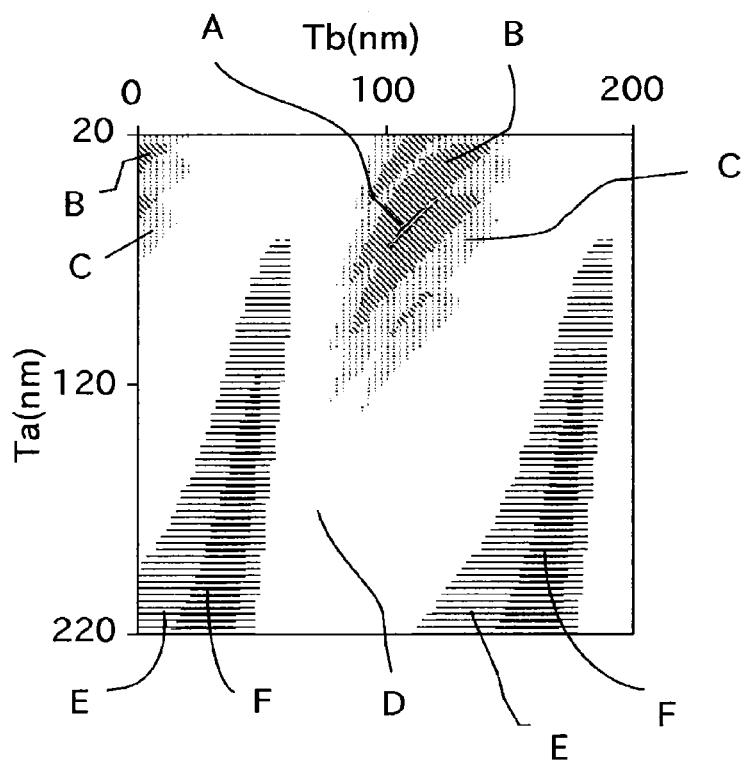
FIG. 11 is a diagram showing a reflectance characteristic of the photoelectric conversion device according to the embodiment of the present invention.

FIGS. 10 and 11 are diagrams showing reflectance characteristics of the photoelectric conversion device according to the embodiment of the present invention. FIGS. 10 and 11 show calculation results for wavelengths of 800 nm and 1000 nm, respectively. The calculations are made similarly to the cases with FIGS. 4 through 9 assuming the conductive layer 8 is formed of amorphous silicon. Higher reflection regions (region A) than the case with the conventional structure appear at either wavelength as shown in these figures. In the case of present structure, it is found that when the conductive layer 8 is formed to have a thickness ranging from around 50 nm to 150 nm, the reflectance can be increased for relatively longer wavelength light of 800 to 1000 nm that readily passes through the photoelectric conversion layer 4. However, since the film thickness range that exhibits a higher reflectance slightly varies in dependence on wavelength, it is preferable to adjust properly the film thickness according the structure of the photoelectric conversion layer 4.

In the photoelectric conversion device according to the present invention, the photoelectric conversion efficiency is enhanced by optimizing the film thickness of the conductive layer 8 taking into account the refractive index of the conductive layer 8 and a desired wavelength range where the reflectance thereof is increased. It should be noted that the film thickness of the conductive layer 8 is not necessarily uniform over its surface. While the light amplification factor by reflection and the wavelength region that exhibits the amplification factor are varied when there is an uneven distribution of the film thickness, it is only necessary that the total amount of light reflected to the photoelectric conversion layer 4, that is, the total amount of reflected photons, in the absorbed wavelength region thereof increases more than the case with no formation of the conductive layer 8. For that reason, the conductive layer 8 may be formed not necessarily over the entire surface, but partially over the surface. However, it is desired that the conductive layer 8 is formed substantially over the entire surface in light of reflectance enhancement.

Figure 12:
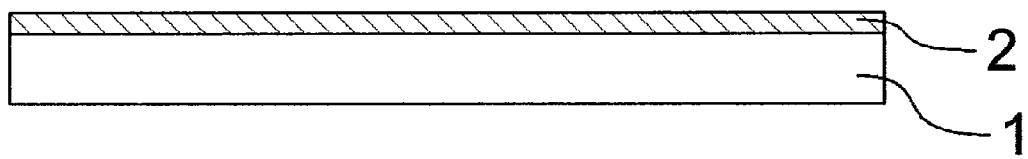
FIG. 12 is a partial cross-sectional view for explaining a manufacturing process of the photoelectric conversion device according to the embodiment of the present invention.
Figure 13:
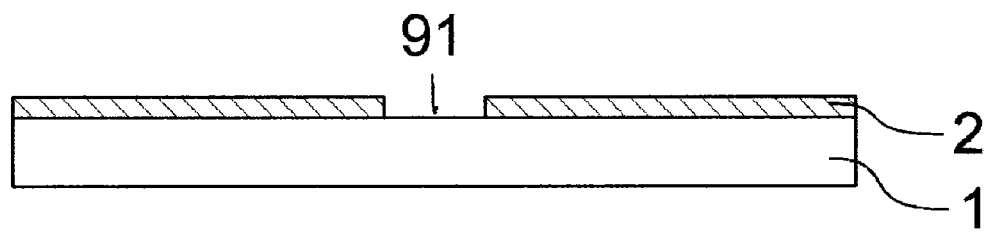
FIG. 13 is a partial cross-sectional view for explaining a manufacturing process of the photoelectric conversion device according to the embodiment of the present invention.
Figure 14:
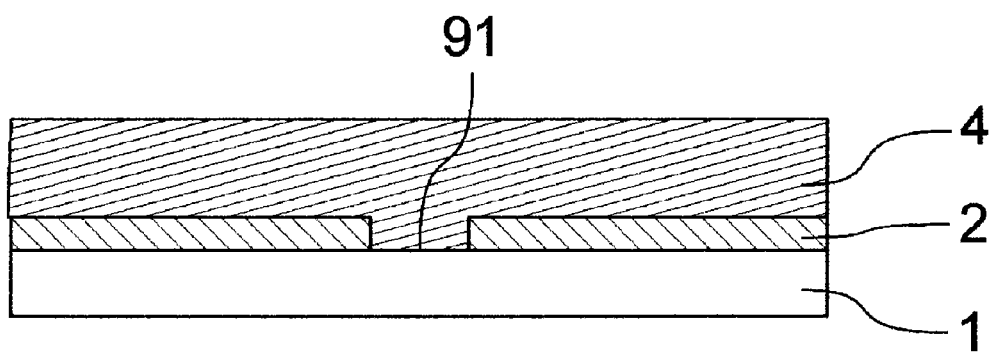
FIG. 14 is a partial cross-sectional view for explaining a manufacturing process of the photoelectric conversion device according to the embodiment of the present invention.
Figure 15:
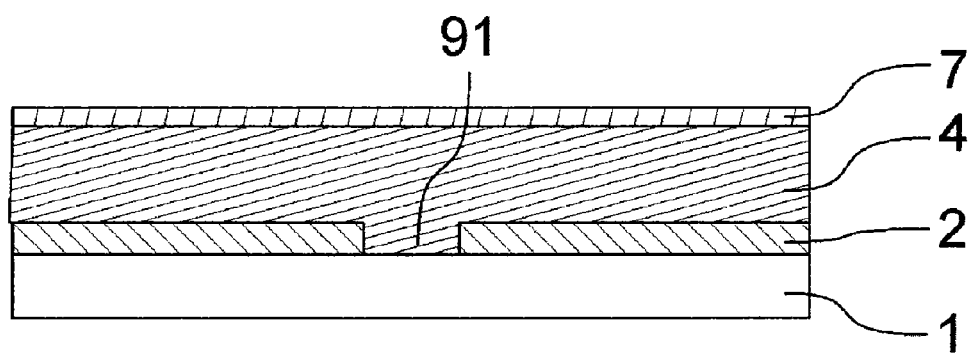
FIG. 15 is a partial cross-sectional view for explaining a manufacturing process of the photoelectric conversion device according to the embodiment of the present invention.
Figure 16:
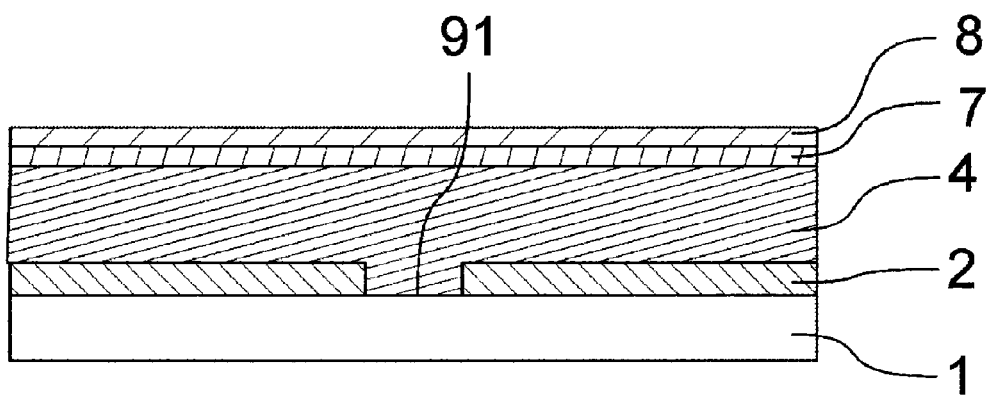
FIG. 16 is a partial cross-sectional view for explaining a manufacturing process of the photoelectric conversion device according to the embodiment of the present invention.
Figure 17:
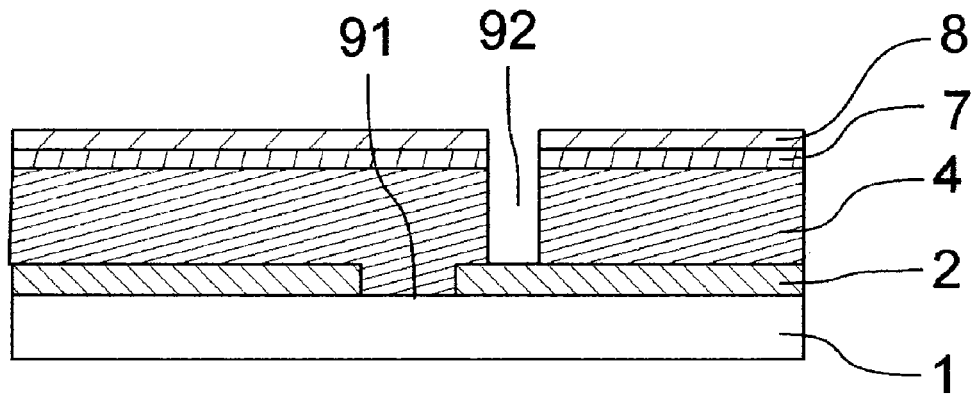
FIG. 17 is a partial cross-sectional view for explaining a manufacturing process of the photoelectric conversion device according to the embodiment of the present invention.
Figure 18:
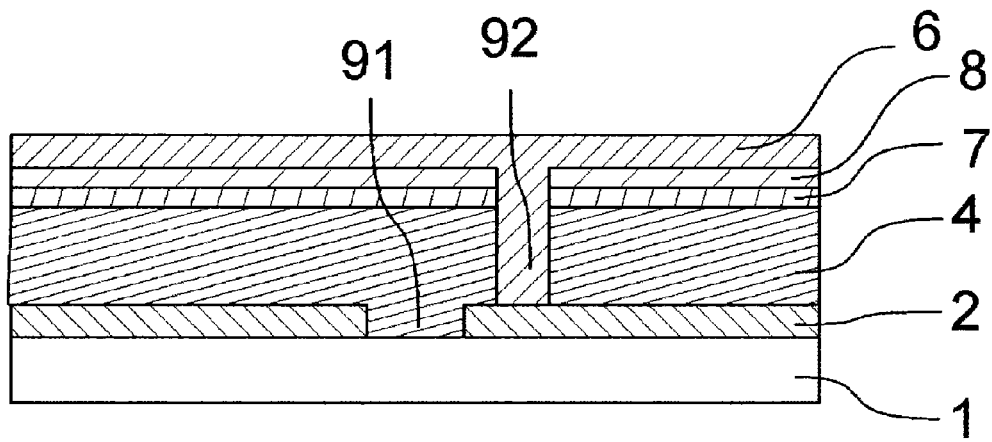
FIG. 18 is a partial cross-sectional view for explaining a manufacturing process of the photoelectric conversion device according to the embodiment of the present invention.
Figure 19:
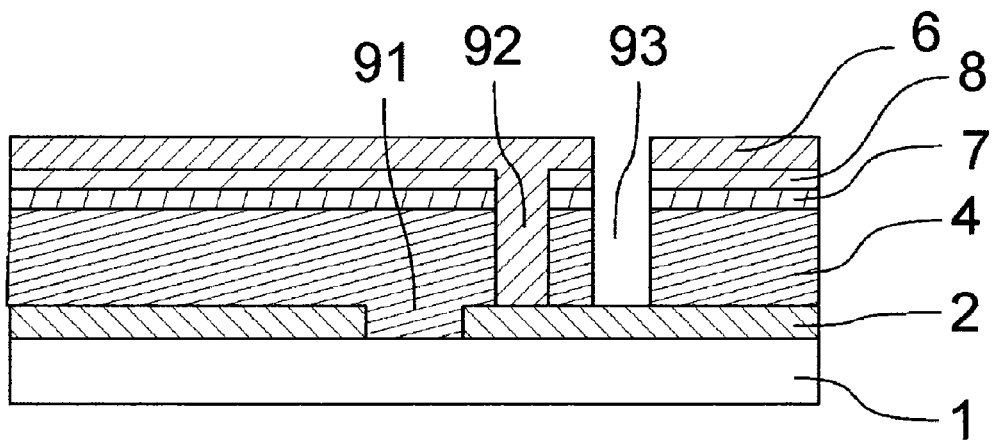
FIG. 19 is a partial cross-sectional view for explaining a manufacturing process of the photoelectric conversion device according to the embodiment of the present invention.

A typical manufacturing method for the photoelectric conversion device of the present invention will be described below. FIGS. 12 through 19 are partial cross-sectional views for explaining processes of manufacturing the photoelectric conversion device according to the embodiment of the present invention. These are enlarged views illustrating the portion around the boundary between the adjacent photoelectric conversion elements 10 of the photoelectric conversion device 100 shown in FIG. 2. First, the light-transmissive insulation substrate 1 having the transparent-conductive-film front electrode 2 formed thereon is prepared as shown in FIG. 12. Next, the front electrode 2 is segmented between the photoelectric conversion elements 10, as shown in FIG. 13, by forming the first groove 91 in the front electrode 2 using a laser scribing method or the like. Next, the photoelectric conversion layer 4 is formed on the front electrode 2, as shown in FIG. 14, using a CVD method or the like. The photoelectric conversion layer 4 is formed by deposition of p-, and n-type semiconductor layers. The photoelectric conversion layer may have a multi-layered structure such that a plurality of combinations of p-, i-, and n-type semiconductors are layered. Next, the thin transparent back conductive layer 7 consisting primarily of, for example, ZnO is formed on the photoelectric conversion layer 4, as shown in FIG. 15, using a sputtering method, a CVD method, a vapor deposition method, or the like. Next, the conductive layer 8 is formed on the transparent back conductive layer 7, as shown in FIG. 16, using a CVD method or the like. The conductive layer 8 is a thin amorphous silicon film. Next, the second groove 92 is formed at a position slightly away from the first groove 91 so that the front electrode 2 is kept intact at the bottom of the second groove 92, as shown in FIG. 17, using a laser scribing method or the like. Next, the back electrode 6 of Ag or the like is formed on the conductive layer 8 as shown in FIG. 18. At this time, the back electrode 6 is brought into contact with the front electrode 2 through inside the second groove 92. Thus, electrical connection is established between one element and the other element of the adjacent photoelectric conversion elements 10. Next, the third groove 93 is formed in the back electrode 6 at a position slightly away from the second groove 92 and opposite to the first groove 91, as shown in FIG. 19, using a laser scribing method or the like. The back electrode 6 is thereby segmented between the adjacent photoelectric conversion elements 10. The figure shows a case of forming the groove in the back electrode 6 by removing the back electrode 6 along with the photoelectric conversion layer 4. At that time, the front electrode 2 is kept intact at the bottom of the third groove 93. Through the processes described above, the photoelectric conversion device 100 of FIG. 2 is completed.

As described in the above embodiment, in a photoelectric conversion device according to the present invention, the conductive layer 8 formed of a p-, i-, or n-type silicon-based semiconductor thin film is interposed in the interface between the transparent back conductive layer 7 and the back electrode 6, so that the reflectance can be enhanced for a desired wavelength region by utilizing internal light-interference effect of the conductive layer 8. Consequently, light utilization efficiency of the photoelectric conversion layer 4 is enhanced, realizing a photoelectric conversion device of high generation efficiency.

A description is made here for the embodiment of the present invention by taking as an example a photoelectric conversion device having one semiconductor photoelectric conversion layer. However, the present invention is not limited to this, but can be achieved by any embodiments as long as they do not depart from the scope of the present invention. For example, the present invention is not limited to a photoelectric conversion device that is formed of one semiconductor photoelectric conversion layer, but can be applied to a multi-layered type photoelectric conversion device that is formed of two or more photoelectric conversion semiconductor layers.

Embodiment 2

Figure 20:
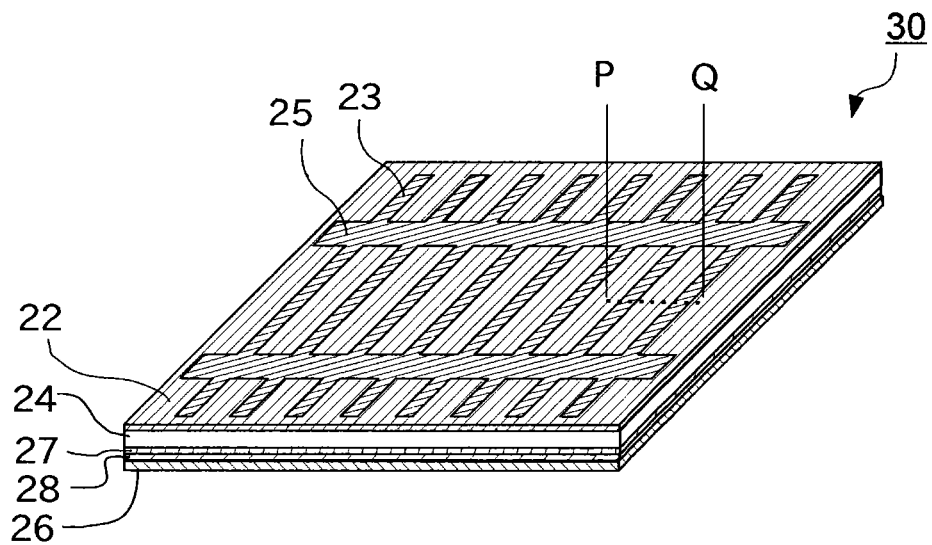
FIG. 20 is an oblique perspective view showing a structure of a photoelectric conversion device according to an embodiment 2 of the present invention.
Figure 21:
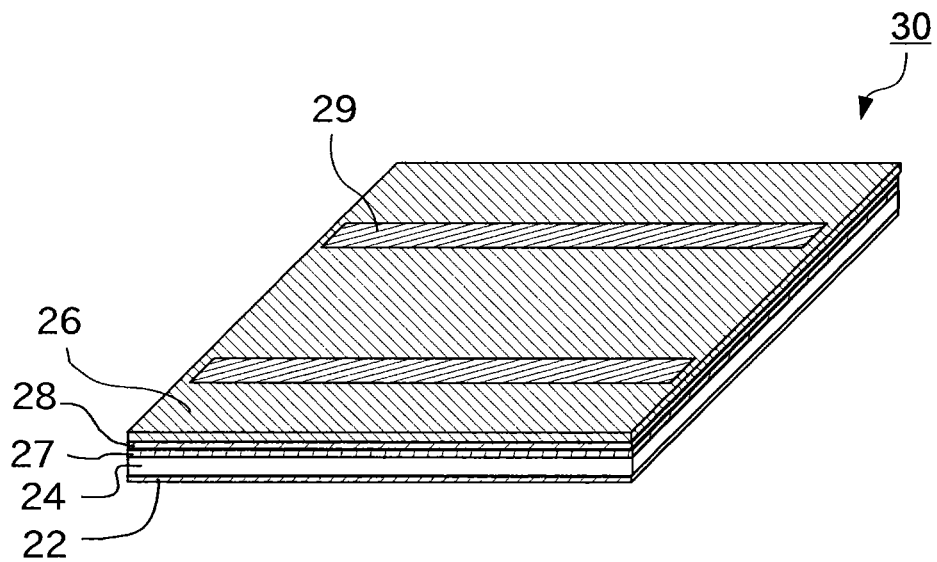
FIG. 21 is another oblique perspective view showing the structure of the photoelectric conversion device according to the embodiment 2 of the present invention.
Figure 22:
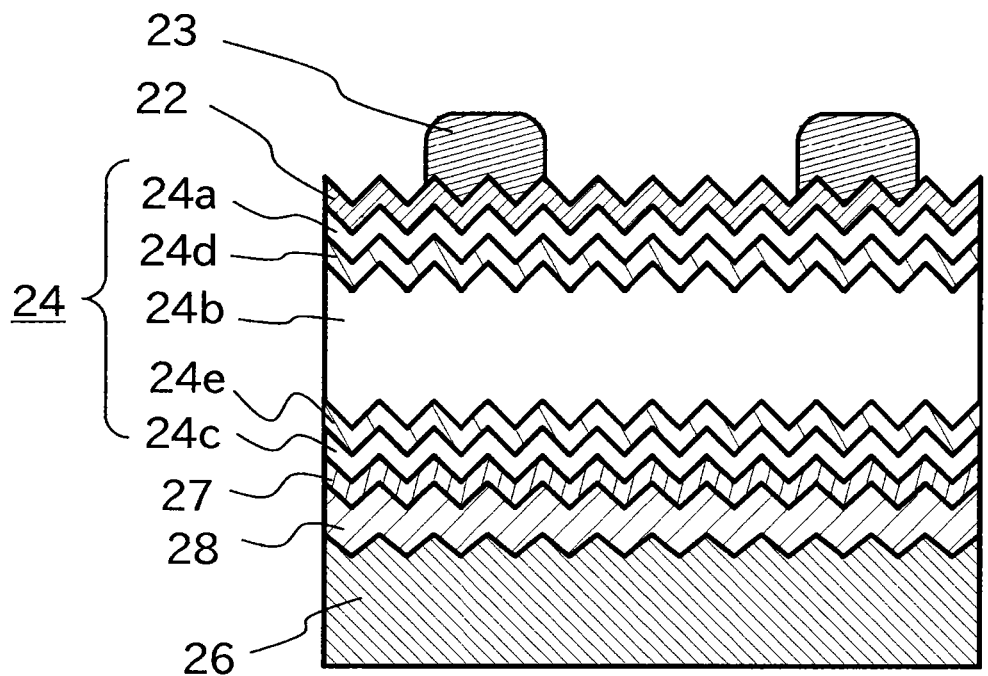
FIG. 22 is a cross-sectional view illustrating the structure of the photoelectric conversion device according to the embodiment 2 of the present invention.

FIGS. 20 and 21 are oblique perspective views showing a structure of a photoelectric conversion element 30 that is a photoelectric conversion device according to an embodiment 2. The photoelectric conversion element 30 is a crystalline solar cell employing a semiconductor crystal. FIG. 20 is an oblique perspective view of the front side to which light is incident (light-receiving side), and FIG. 21 is an oblique perspective view of the backside. FIG. 22 is a cross-sectional view taken along the dotted line P-Q in FIG. 20, illustrating a structure of the photoelectric conversion element 30 of the embodiment 2. While the photoelectric conversion element 10 of the embodiment 1 needs the light-transmissive insulation substrate 1 because of a thin film, the photoelectric conversion device of the embodiment 2 does not necessarily need the light-transmissive insulation substrate 1 since it is a crystalline solar cell employing a self-supportable semiconductor crystal.

A photoelectric conversion layer 24 of the photoelectric conversion element 30 includes a semiconductor crystal substrate, or the substrate and a semiconductor film formed thereon. In the photoelectric conversion layer 24, a doped semiconductor layer is formed in a p- or n-type crystal semiconductor substrate by doping it with an impurity whose conductive type is inverse to the substrate, to form a p-n junction. Such a doped layer is formed inside a substrate by a thermal diffusion method or formed on a substrate surface by a deposition method using a film forming technique. In the embodiment 2, the doped layer is formed by the latter method.

Specifically, a p-type amorphous silicon film 24a and an n-type amorphous silicon film 24c are formed as doped layers on the light-receiving side of an n-type single crystal silicon substrate 24b and on the backside thereof, respectively, using a CVD method. Further, between each doped layer and the single crystal silicon substrate 24b, an intrinsic i.e., i-type amorphous silicon film 24d and an intrinsic i.e., i-type amorphous silicon film 24e are formed on the light receiving side and on the backside, respectively. These i-type amorphous silicon films 24d and 24e reduce surface defects of the single crystal silicon substrate 24b and thereby improve the photoelectric conversion characteristic. The thickness of the single crystal silicon substrate 24b is typically 100 to 300 microns, the thicknesses of the i-type amorphous silicon films 24d and 24e are 1 to 10 nm, and the thicknesses of the p-type amorphous silicon film 24a and the n-type amorphous silicon film 24c are 3 to 10 nm. The shape of the single crystal silicon substrate 24b is a square, a rounded square, a near square rectangular, or the like having a side length of 100 to 160 mm, or may be a circle or a polygon. It is preferable to form fine asperities on the light receiving surface of the single crystal silicon substrate 24b by an anisotropic etching or the like because light absorption increases. Similar asperities may be also formed on the back surface thereof.

A front electrode 22 that is a transparent conductive film of ZnO, ITO, SnO$_2$, or the like is formed on the light receiving surface of the p-type amorphous silicon film 24a using a vapor deposition method or a sputtering method. It is preferable that the thickness of the front electrode 22 is adjusted so as to bring about antireflection effect due to interference effect for light having wavelengths contained with a high proportion in sunlight. Further, collector electrodes 23 are formed on the front electrode 22 from a metal paste. The collector electrodes 23 are thin lines of, for example, 100 microns arranged in parallel at 2 to 3 mm intervals. The collector electrodes may be arranged in a tree-like or mesh-like shape. Bus electrodes 25 are formed so as to cross the collector electrodes 23. The bus electrodes 25 are ribbon electrodes with a width of about 1 to 2 mm, and are connected to tab lines for externally extracting electric power generated by the photoelectric conversion device. The numbers of collector electrodes 23 and bus electrodes 25, and their spacing may be properly adjusted taking into account the amount of generated power and loss.

On the back-side n-type amorphous silicon film 24c, formed are a transparent back conductive layer 27, a conductive layer 28 consisting primarily of silicon, and a back electrode 26 formed of Ag or the like. The thicknesses thereof and forming method therefor are the same as those described in the embodiment 1. The transparent back conductive layer 27, the back electrode 26, and the conductive layer 28 are preferably formed of ZnO, a material consisting primarily of Ag, and impurity-doped amorphous silicon or impurity-doped fine crystalline silicon, respectively. Bus electrodes 29 are formed on the back electrode 26 as with the front side. Collector electrodes may be formed on the backside as with the front side.

Figure 23:
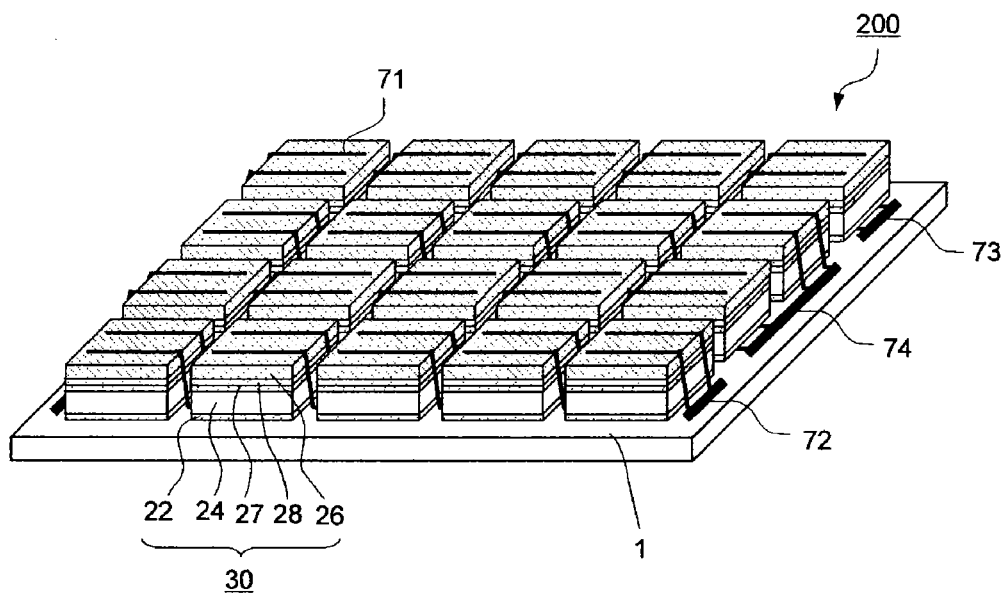
FIG. 23 is an oblique perspective view showing a configuration example of the photoelectric conversion device according to the embodiment 2 of the present invention.

FIG. 23 is an oblique perspective view showing a configuration example of a photoelectric conversion device 200 that is integrally made up of the photoelectric conversion elements 30 of the embodiment 2. A plurality of the photoelectric conversion elements 30 are arranged, with their light-receiving surfaces facing to the light-transmissive insulation substrate 1, so as to photoelectrically convert light incident from the light-transmissive insulation substrate 1. One ends of tab lines 71 are connected with the bus electrodes 25 on the light-receiving side of the photoelectric conversion element 30 and the other ends thereof are connected to the bus electrodes 29 on the backside of its adjacent photoelectric conversion element 30, to connect serially the adjacent photoelectric conversion elements with each other. A plurality of the spaced tab lines 71 are connected to each photoelectric conversion element 30. The ends of the tab lines 71 establishing the serial connection are respectively connected to connecting lines 72 and 73. The adjacent photoelectric conversion elements 30 in the peripheral region of the light-transmissive insulation substrate 1 are connected with each other through connecting lines 74 provided near their sides.

The light-transmissive insulation substrate 1 and the photoelectric conversion elements 30 are fixed to each other by a transparent adhesive. Although not shown in the figure, the backside of the photoelectric conversion elements 30 are covered with a sealant such as a sealing sheet also by an adhesive. The connecting lines 72 and 73 at the respective ends of the serial connection are connected to lead lines, and the other ends of the lead lines are drawn out from the sealant.

In the photoelectric conversion elements 30 and the photoelectric conversion element 200 of the embodiment 2, since the conductive layer 28 that is formed of a semiconductor material consisting primarily of silicon and having a refractive index higher than the transparent back conductive layer 27 is also formed between the transparent back conductivity layer 27 and the back electrode 26, the reflectance is increased particularly for longer wavelength in sunlight, thereby enhancing the conversion efficiency, and the electrical resistance between the photoelectric conversion layer 24 and the back electrode 26 can be kept low at the same time.

INDUSTRIAL APPLICABILITY

The present invention can be utilized for performance increase of a photoelectric conversion device that converts light such as sunlight into electricity.

REFERENCE NUMERALS

1: light-transmissive insulation substrate
2, 22: front electrode 4, 24: photoelectric conversion layer
6, 26: back electrode
7, 27: transparent back conductive layer
8, 28: conductive layer
10, 30: photoelectric conversion element
23: collector electrodes
25, 29: bus electrodes
71: tab lines
72, 73, 74: connecting lines
91: first grooves
92: second grooves
93: third grooves
100, 200: photoelectric conversion device

The invention claimed is:

1. A photoelectric conversion device comprising:
a front electrode,
a photoelectric conversion layer formed of a semiconductor material,
a transparent conductive layer formed of a transparent conductive oxide,
a conductive layer formed of a semiconductor material consisting primarily of silicon and having a refractive index higher than the transparent conductive layer,
a back electrode formed of a metal material;
said front electrode, said photoelectric conversion layer, said transparent conductive layer, said conductive layer, and said back electrode arranged in that order;
the conductive layer contactually sandwiched between the transparent conductive layer and the back electrode;
the back electrode directly contacting the conductive layer along a plane parallel to the major longitudinal axis of the conductive layer;
the refractive index of the conductive layer being 3.4 or higher at a wavelength of 850 nm; and
a film thickness of the conductive layer being between 30 nm and 300 nm.

2. The photoelectric conversion device of claim 1, wherein the transparent conductive layer consists primarily of zinc oxide and the back electrode consists primarily of silver.

3. The photoelectric conversion device of claim 1, wherein the conductive layer is formed of conductive amorphous silicon doped with an impurity.

4. The photoelectric conversion device of claim 1, wherein the conductive layer is formed of conductive fine-crystalline silicon doped with an impurity.

5. The photoelectric conversion device of claim 1, wherein the conductive layer is an n-type semiconductor.

6. The photoelectric conversion device of claim 2, wherein the conductive layer has a refractive index of 3.4 or higher at wavelength of 850 nm.

7. The photoelectric conversion device of claim 6, wherein the conductive layer is formed of conductive amorphous silicon doped with an impurity.

8. The photoelectric conversion device of claim 3, wherein a film thickness of the conductive layer is within a range from 30 to 300 nm.

9. The photoelectric conversion device of claim 4, wherein the conductive layer is an n-type semiconductor.

10. The photoelectric conversion device of claim 6, wherein the conductive layer is formed of conductive fine-crystalline silicon doped with an impurity.

11. The photoelectric conversion device of claim 10, wherein a film thickness of the conductive layer is within a range from 50 to 150 nm.

12. The photoelectric conversion device of claim 11, wherein the conductive layer is an n-type semiconductor.

13. The photoelectric conversion device of claim 1, wherein the film thickness of the conductive layer is within a range from 50 to 150 nm.

14. The photoelectric conversion device of claim 2, wherein the film thickness of the conductive layer is within a range from 50 to 150 nm.

15. A photoelectric conversion device comprising:
a front electrode,
a photoelectric conversion layer formed of a semiconductor material,
a transparent conductive layer formed of a transparent conductive oxide,
a conductive layer formed of a semiconductor material consisting primarily of silicon and having a refractive index higher than the transparent conductive layer,
a back electrode formed of a metal material, formed on the conductive layer, and extending in a plane parallel to the major longitudinal axis of the conductive layer;
said front electrode, said photoelectric conversion layer, said transparent conductive layer, said conductive layer, and said back electrode arranged in that order;
the conductive layer contactually sandwiched between the transparent conductive layer and the back electrode;
the back electrode directly contacting the conductive layer along said plane parallel to the major longitudinal axis of the conductive layer; and the refractive index of the conductive layer is 3.4 or higher at a wavelength of 850 nm.

* * * * *